United States Patent
Namba (10) Patent No.: US 8,259,284 B2
(45) Date of Patent: Sep. 4, 2012

(54) EXPOSURE APPARATUS AND DEVICE MANUFACTURING METHOD

(75) Inventor: Hisashi Namba, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 489 days.

(21) Appl. No.: 12/546,930

(22) Filed: Aug. 25, 2009

(65) Prior Publication Data

US 2010/0055623 A1    Mar. 4, 2010

(30) Foreign Application Priority Data

Aug. 27, 2008   (JP) ................................. 2008-218457

(51) Int. Cl.
*G03B 27/52*    (2006.01)
(52) U.S. Cl. .......................................... 355/30; 417/901
(58) Field of Classification Search .................... 355/30, 355/53; 378/34; 417/3, 32, 62, 901; 430/311, 430/325
See application file for complete search history.

(56) References Cited

U.S. PATENT DOCUMENTS

| | | | |
|---|---|---|---|
| 7,196,769 B2 | 3/2007 | Miyajima | |
| 7,330,236 B2 | 2/2008 | Hasegawa | |
| 2004/0035570 A1* | 2/2004 | Hara | 165/289 |
| 2004/0179178 A1* | 9/2004 | Emoto | 355/53 |
| 2005/0110966 A1 | 5/2005 | Hasegawa | |
| 2005/0275821 A1 | 12/2005 | Miyajima | |
| 2006/0017896 A1* | 1/2006 | Hara et al. | 355/30 |
| 2007/0199201 A1* | 8/2007 | Tanaka | 34/92 |
| 2007/0236673 A1* | 10/2007 | Namba et al. | 355/30 |

FOREIGN PATENT DOCUMENTS

JP    2005-101537 A    4/2005
JP    2005-353986 A    12/2005

* cited by examiner

*Primary Examiner* — Hung Henry Nguyen
*Assistant Examiner* — Steven H Whitesell Gordon
(74) *Attorney, Agent, or Firm* — Canon USA Inc. IP Division (57) ABSTRACT

An exposure apparatus of the present invention includes a vacuum container accommodating a structure, a vacuum pump configured to increase the degree of vacuum achieved inside the vacuum container, a radiation unit configured to perform a heat exchange through radiation for the structure, a temperature detecting unit configured to detect the temperature of the structure, and a control unit configured to control the radiation unit based on the detected temperature, wherein the radiation unit is arranged at a position determined so that the radiation unit does not interfere with a heat exchange achieved through radiation between the vacuum pump and the structure.

10 Claims, 9 Drawing Sheets

EXPOSURE APPARATUS AND DEVICE MANUFACTURING METHOD

BACKGROUND OF THE INVENTION

1. Field of the Invention

The present invention relates to an exposure apparatus exposing a substrate to light and particularly relates to an exposure apparatus including a vacuum pump which evacuates the interior of the exposure apparatus.

2. Description of the Related Art

Exposure apparatuses that project a circuit pattern written on a reticle (mask) on a wafer or the like through a projection optical system have been used to manufacture a minute semiconductor element including a memory, a logic circuit, and so forth.

The minimum critical dimension (resolution) that can be transferred through the exposure apparatus is proportional to the wavelength of light used to perform an exposure and is inversely proportional to the numerical aperture (NA) of the projection optical system. Therefore, the wavelength of light used to perform an exposure has become increasingly shorter in accordance with the need for micro-miniaturizing the semiconductor element. Then, exposure apparatuses using extreme ultra-violet (EUV) light having a wavelength of from 10 nm to 15 nm or around (EUV exposure apparatus) have been developed so as to transfer a minute circuit pattern having a length of 100 nm or less with efficiency.

EUV light is easily attenuated by gas, and induces a photochemical reaction between an impurity including carbon and oxygen so that a carbon compound is adhered to an optical element. According to the EUV exposure apparatus, therefore, an exposure is performed in a vacuum environment.

When using a vacuum pump so as to evacuate the interior of the exposure apparatus, the temperature of each of other elements included in the exposure apparatus is changed due to heat generated and/or absorbed by the vacuum pump so that the circuit pattern may be transferred with a decreased precision. Particularly, it is difficult to use a material with a small linear expansion coefficient, which is used for a mirror, for a barrel holding the mirrors of a projection optical system and/or a structure provided with a position measuring unit arranged therein. Therefore, an unallowable position shift may occur due to a little temperature change so that the circuit patterns may be transferred and overlaid with a decreased precision.

The following configurations have been proposed to reduce an influence caused by heat generated and/or absorbed by a vacuum pump.

According to Japanese Patent Laid-Open No. 2005-353986, a cryo panel (cryo pump) and an electric-field trap panel are provided near a mirror and the temperature of the mirror is adjusted through the electric-field trap panel so that a thermal influence exerted by the cryo panel is reduced. According to Japanese Patent Laid-Open No. 2005-101537, a shield is arranged so as to surround a cryo panel arranged in a projection optical system, so as to reduce a thermal influence exerted by the cryo panel on the mirror. Further, the temperature of the shield and/or the cryo panel is controlled so that the temperature of the mirror is controlled and kept in a predetermined range.

According to Japanese Patent Laid-Open No. 2005-353986, the degree of vacuum around the mirror is increased through the cryo panel. However, since the electric-field trap panel is arranged so as to be opposed to the cryo panel, the absorption efficiency achieved by the cryo panel is decreased. Namely, for achieving the same degree of vacuum as that achieved in the case where no electric-field trap panel is provided, a large-sized vacuum pump should be arranged. If the size of the vacuum pump is increased, an increased thermal influence is exerted on members other than the mirror, such as a barrel.

Since the shield is also arranged to surround the cryo panel according to Japanese Patent Laid-Open No. 2005-101537, the absorption efficiency achieved by the cryo panel is decreased. Consequently, the same problem as that disclosed in Japanese Patent Laid-Open No. 2005-353986 occurs.

Further, the temperature of the mirror is changed not only by a change in the temperature of the vacuum pump, but also by an exposure. Therefore, when the temperature of the shield is controlled based on a result of the measurement of the mirror temperature for changing the shield temperature so as to reduce a thermal influence exerted by the vacuum pump, the controlled temperature may become a thermal disturbance for members other than the mirror, such as the barrel. Further, if the vacuum pump and the shield are arranged in different directions with reference to members other than the mirror, such as the barrel, a temperature distribution may occur in a member such as the barrel so that the member is deformed.

SUMMARY OF THE INVENTION

The present invention is provided to reduce a thermal influence exerted by a vacuum pump on a structure provided in a vacuum container without decreasing the evacuation efficiency of the vacuum pump.

An exposure apparatus according to an embodiment of the present invention includes a vacuum container accommodating a structure, a vacuum pump configured to increase a degree of vacuum achieved inside the vacuum container, a radiation member configured to perform a heat exchange through radiation for the structure, a temperature detecting unit configured to detect a temperature of the structure, and a control unit configured to control the radiation unit based on the detected temperature, wherein the radiation unit is arranged at a position determined so that the radiation unit does not interfere with a heat exchange achieved through radiation between the vacuum pump and the structure.

Further, an exposure apparatus according to another embodiment of the present invention includes a vacuum container accommodating a structure, a pump configured to increase a degree of vacuum achieved inside the vacuum container, a reference temperature member arranged between the pump and the structure, a radiation unit configured to perform a heat exchange through radiation for the structure and the reference temperature member, a temperature detecting unit configured to detect a temperature of the reference temperature member, and a control unit configured to control the radiation unit based on the detected temperature, wherein the radiation unit is arranged at a position determined so that the radiation unit does not interfere with a heat exchange achieved through radiation between the vacuum pump and the structure.

For example, if the radiation unit is provided around the cryo panel, around the opening of a duct of the turbo molecular pump, or inside the duct, the evacuation efficiency of the vacuum pump is hardly decreased. Further, since the direction in which the vacuum pump is arranged is approximately equal to that in which the radiation unit is arranged with reference to the structure, a thermal influence exerted by the vacuum pump and the radiation unit on the structure can be cancelled and the temperature distribution of the structure can be significantly reduced.

Further features of the present invention will become apparent from the following description of exemplary embodiments with reference to the attached drawings.

DESCRIPTION OF THE EMBODIMENTS

An exposure apparatus and a device manufacturing method according to an embodiment of the present invention will be described in detail with reference to the attached drawings.

First Embodiment

Figure 1:
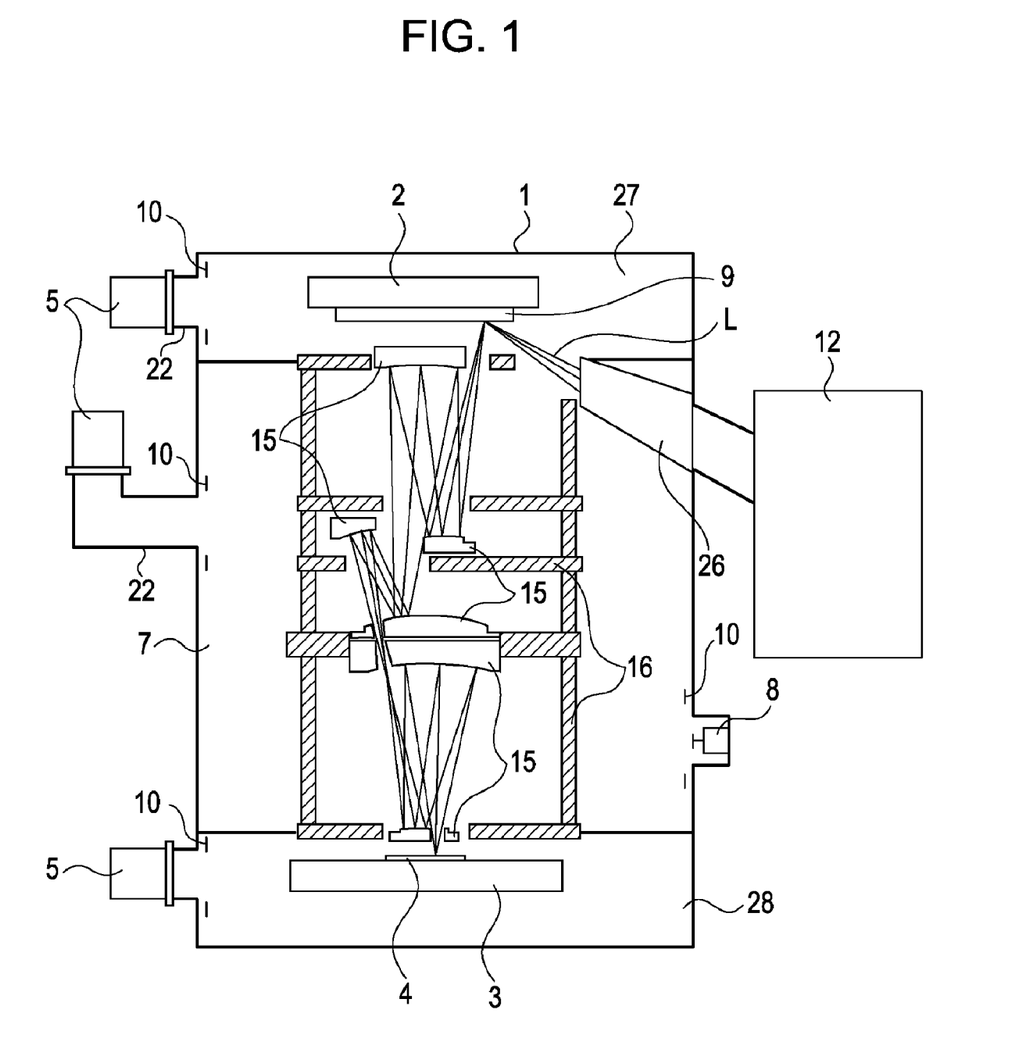
FIG. 1 is a schematic configuration diagram of an exposure apparatus according to a first embodiment of the present invention.

FIG. 1 is a schematic configuration diagram of an exposure apparatus according to a first embodiment of the present invention. The above-described exposure apparatus includes a light source 12 emitting EUV light. The interior of the exposure apparatus is hermetically sealed in a vacuum chamber (vacuum container) 1, and the interior of the vacuum chamber 1 is evacuated to vacuum through a turbo molecular pump (vacuum pump) 5. EUV light L emitted from the light source 12 is reflected from a reticle 9 held on a reticle stage 2 and optical elements 15 that are included in a projection optical system so that a wafer 4 placed on a waver stage 3 is irradiated with the EUV light L. Consequently, the circuit pattern of the reticle 9 is projected onto the wafer 4.

The vacuum chamber 1 is separated into illumination-optical-system space 26, reticle-stage space 27, wafer-stage space 28, and projection-optical-system space 7. Each of the above-described spaces is provided with the turbo molecular pump 5 so that each of the above-described spaces is kept at an appropriate degree of vacuum. While the turbo molecular pump 5 is operated, the temperature of a vane of the turbo molecular pump 5 is high. Therefore, radiation energy is emitted into the vacuum chamber 1 through a duct 22 connecting the turbo molecular pump 5 to the vacuum chamber 1.

Particularly, a barrel 16 holding mirrors 15 is accommodated in the projection-optical-system space 7, and a slight change in the temperature causes the barrel 16 to expand and contract so that the position of each of the mirrors 15 is shifted. For example, if a low-thermal expansion alloy is used as a material of the barrel 16, the barrel 16 expands and contracts by as much as a few nanometers or more even though the entire barrel 16 is changed by as much as 0.01° C., because the linear expansion coefficient of the low-thermal expansion alloy is 0.5 to $1.0 \times 10^{-6}/°$ C. or around. Particularly, since the barrel 16 expanding and contracting has a significant influence on the overlay accuracy of patterns, the expansion and the contraction of the barrel 16 become a problem.

Figure 2:
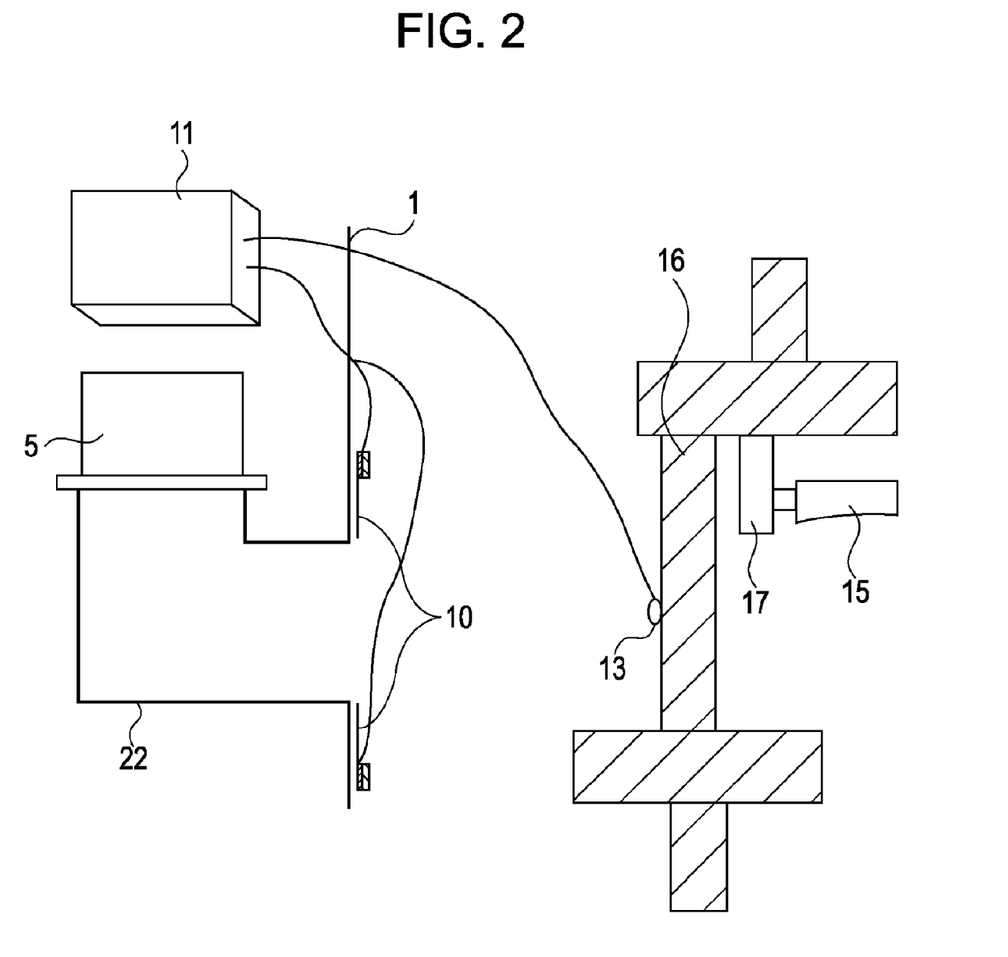
FIG. 2 is a diagram schematically showing the principal mechanism of the first embodiment.
Figure 3:
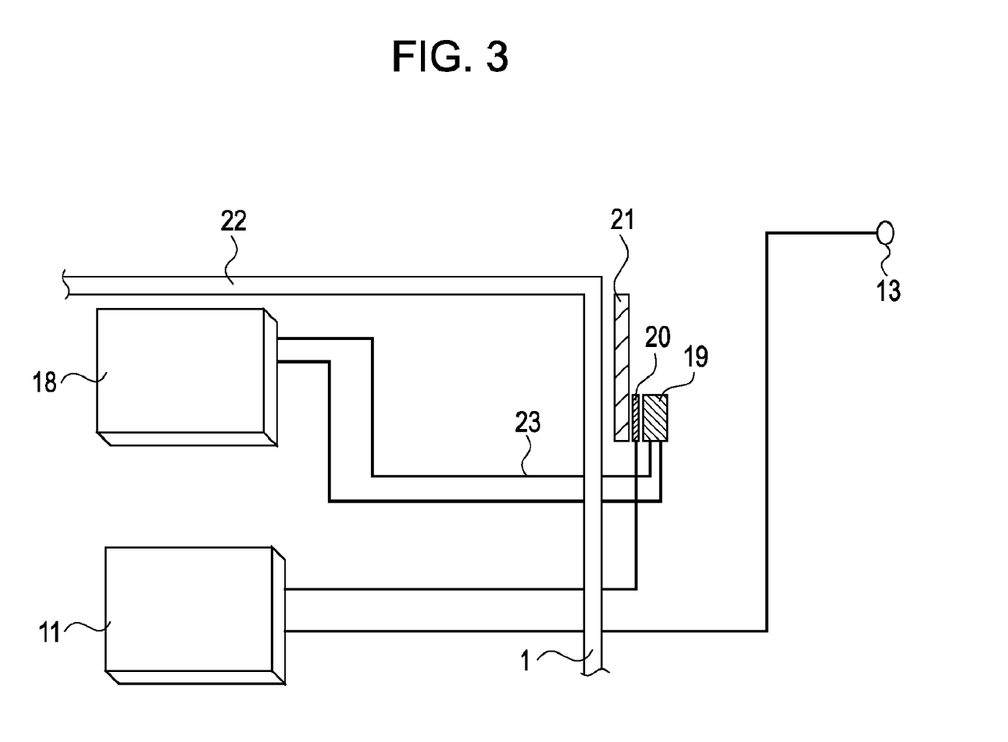
FIG. 3 is another diagram schematically showing the principal mechanism of the first embodiment.

A specific configuration devised to reduce a change in the temperature of the barrel 16 will be described with reference to FIGS. 2 and 3, where each of FIGS. 2 and 3 shows a magnified view of the principal mechanism of the above-described embodiment. The turbo molecular pump 5 and the vacuum chamber 1 are connected to each other through the duct 22, and the radiation member (radiation unit) 10 is provided around the vacuum-chamber-1's side opening of the duct 22.

Further, the barrel 16 including the mirrors 15 and mirror-holding members 17 is provided at a position opposite to the vacuum-chamber-1's side opening of the duct 22 and the radiation member 10. A temperature sensor (temperature detection unit) 13 configured to measure the temperature of the barrel 16 is attached to the barrel 16, and the temperature sensor 13 is connected to a temperature controller 11. Then, the temperature controller 11 controls the temperature of the radiation member 10, so as to keep the detected temperature of the temperature sensor 13 constant.

The radiation member 10 is arranged at a position determined so that the radiation member 10 hardly intercepts a heat exchange achieved by radiation between the turbo molecular pump 5 and the barrel 16 corresponding to a structure. Namely, the radiation member 10 is provided at a position determined so that the radiation member 10 does not interfere with gas moving from the vicinity of the barrel 16 toward the turbo molecular pump 5. Therefore, the radiation member 10 hardly reduces the evacuation efficiency of the turbo molecular pump 5.

More specifically, the radiation member 10 may be arranged so that the conductance between the turbo molecular pump 5 and the barrel 16 is decreased by as much as 15% or less. Further, the radiation member 10 may be provided so that the conductance is decreased by as much as 10% or less.

Further, the temperature sensor 13 is provided at a position determined so that thermal influences exerted by the turbo molecular pump 5 and the radiation member 10 on the temperature sensor 13 become approximately identical to each other. By keeping the temperature measured at the above-described position constant, it becomes possible to make the amount of heat emitted from the turbo molecular pump 5 into the projection-optical-system space 7 approximately equal to that absorbed from the projection-optical-system space 7 into the radiation member 10. Namely, the radiation member 10 can cancel the thermal influence exerted by the turbo molecular pump 5 on the barrel 16. Further, in the above-described embodiment, the temperature sensor 13 is provided on the central axis of the duct 22 connecting the turbo molecular pump 5 to the vacuum chamber 1.

Further, the temperature sensor 13 may be provided at a position where the temperature sensor 13 is significantly affected by the turbo molecular pump 5 and the radiation member 10. Consequently, the sensitivity of the temperature sensor 13 is increased.

Further, if the temperature of the position where the temperature sensor 13 is provided is affected by a different heat generation member including a sensor and/or a circuit substrate, control should be performed so that the position is held at a temperature higher than a reference temperature by as much as a temperature increase caused by the heat generation member.

The specific configuration of the radiation member 10 of the above-described embodiment will be described with reference to FIG. 3 showing a further magnified view of a part of the magnified view shown in FIG. 2.

The radiation member 10 includes a radiation plate 21, a Peltier device 20, and a cooling jacket 19.

The barrel-16's side face of the radiation plate 21 includes a material having a radiation rate of 0.6 or more and a high thermal conductivity so that the thermosensitivity of the vacuum pump 5 and/or the barrel 16 is increased. The radiation plate 21 includes ceramic such as aluminum, silicon carbide, etc. Further, the face of a metallic material having a high thermal conductivity may be processed so as to increase the radiation rate of the metallic material. The processing performed to increase the radiation rate includes ceramic evaporation and/or ceramic thermal spraying, glass evaporation, and so forth.

As for the other face of the radiation plate 21, the face being opposite to the barrel-16's side face, the radiation rate is decreased so that the value of the radiation rate becomes 0.2 or less. Consequently, it becomes possible to reduce heat which is directly conducted from the radiation plate 21 to the vacuum chamber 1.

The cooling jacket 19 provided to recover heat generated and/or absorbed by the Peltier device 20 is provided on the back face of the Peltier device 20. The back face of the Peltier device is kept at a constant temperature by supplying a refrigerant controlled and kept at a constant temperature from a chiller 18 to the cooling jacket 19.

Figure 4:
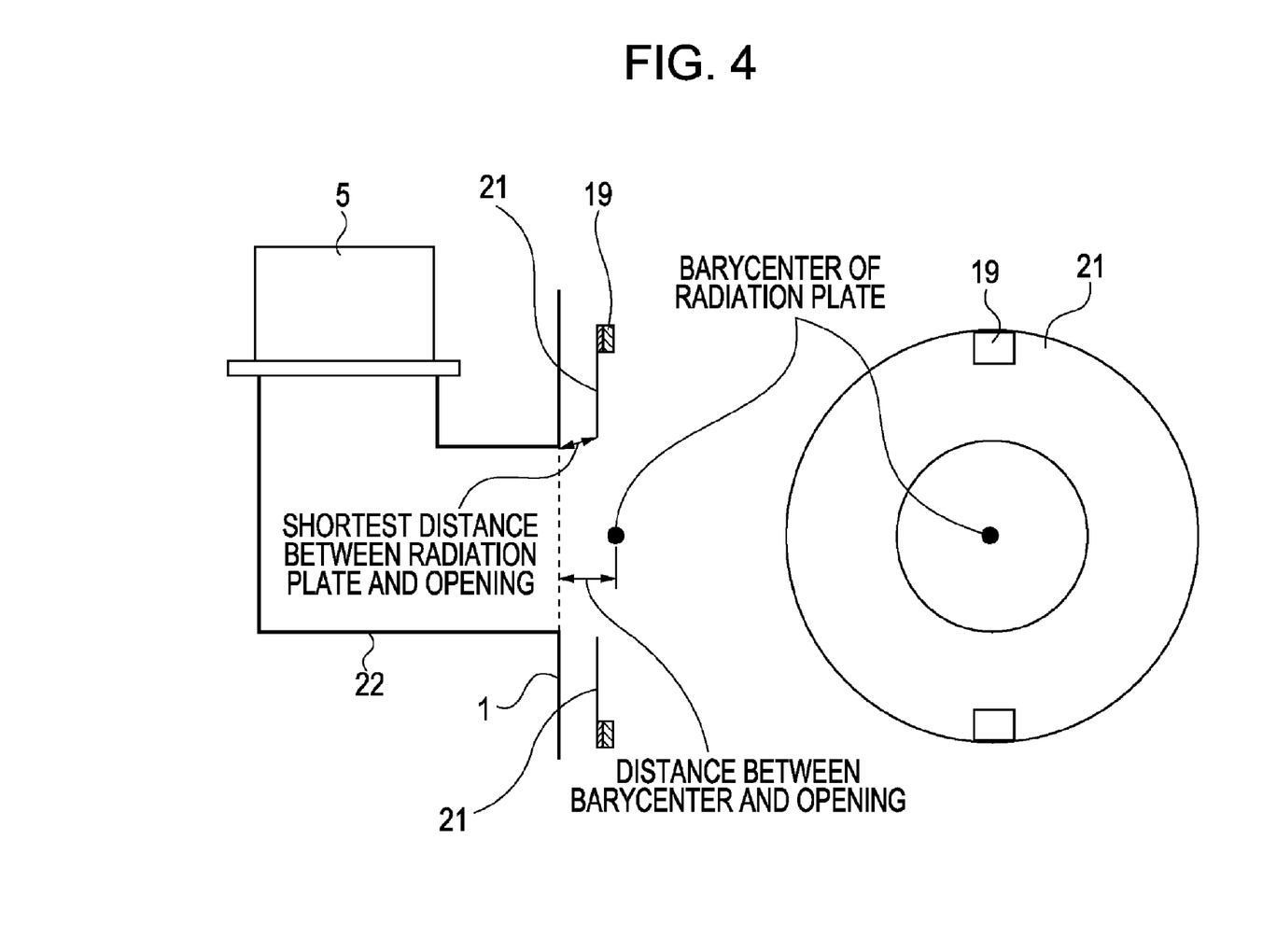
FIG. 4 is an illustration relating to the arrangement of a radiation member according to the first embodiment.

FIG. 4 illustrates an appropriate method of arranging the radiation member 10 of the above-described embodiment. The radiation member 10 is provided around the vacuum-chamber-1's side opening of the duct 22 connecting the turbo molecular pump 5 and the vacuum chamber 1 to each other. More specifically, the radiation member 10 is arranged so as to satisfy at least one of the following conditions.

(a1) The shortest distance between the barycenter of the radiation plate 21 of the radiation member 10 and the opening of the duct 22 is shorter than the diameter of the opening. However, when a plurality of the radiation plates 21 is provided for a single vacuum pump (turbo molecular pump 5), the barycenter of the radiation plate is calculated based on the radiation plates 21.

(b1) The area of the radiation plate 21 of the radiation member 10 is ten times as large as the area of the opening of the duct 22 or less.

(c1) The shortest distance between the radiation plate 21 of the radiation member 10 and the opening of the duct 22 is shorter than the diameter of the opening.

The radiation member 10 is arranged at a position determined to satisfy the above-described conditions. Consequently, the direction in which the vacuum-chamber-1's side opening of the duct 22 connecting the turbo molecular pump 5 and the vacuum chamber 1 to each other is provided becomes almost the same as that in which the radiation member 10 is provided with reference to the barrel 16. Therefore, it becomes possible to equalize the amount of heat absorbed from the turbo molecular pump 5 and that emitted toward the radiation member 10 at each of positions defined on the barrel 16. Therefore, the temperature distribution of the barrel 16 can be significantly reduced.

Second Embodiment

Figure 5:
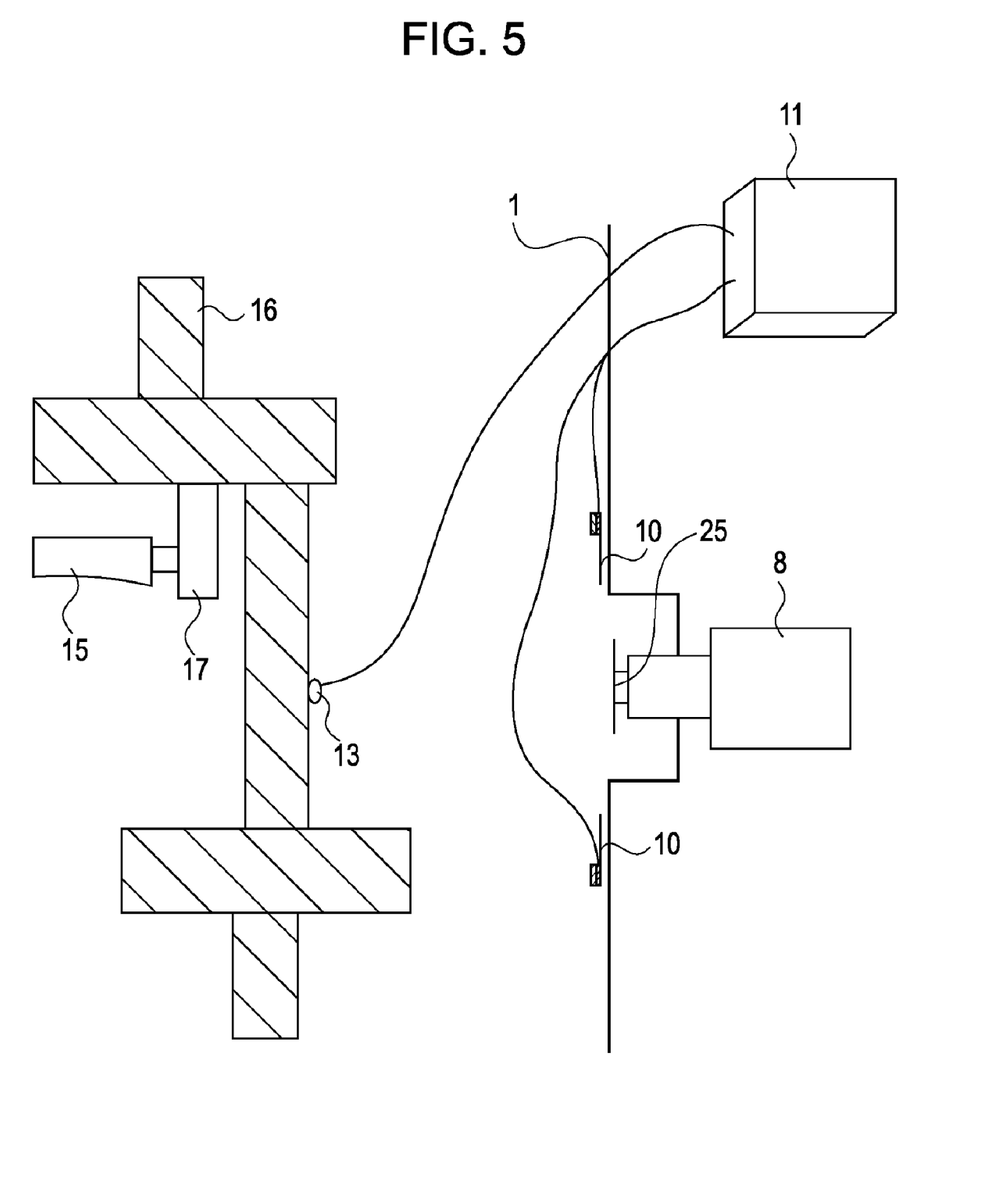
FIG. 5 is a diagram schematically showing the principal mechanism of a second embodiment of the present invention.

FIG. 5 is a diagram schematically showing the principal mechanism of a second embodiment of the present invention. The descriptions of the same configurations as those of the first embodiment will be omitted.

The above-described embodiment is different from the first embodiment in that a cryo pump 8 is used as the vacuum pump. The cryo pump 8 is provided so that a carbon compound generated by irradiating a resist applied on the wafer 4 with EUV light is absorbed in a cooling face 25 which is kept at a temperature of 70K or around, and the density of the carbon compound of the projection-optical-system space 7 is decreased.

Since the cryo pump 8 uses the cooling face 25 kept at a temperature of 70K or around, a thermal influence exerted on the barrel 16 or the like should be reduced.

Therefore, according to the above-described embodiment, the radiation member 10 is provided around the cooling face 25 of the cryo pump 8. The radiation member 10 is arranged at a position determined so that the radiation member 10 hardly intercepts a heat exchange achieved by radiation between the cooling face 25 of the cryo pump 8 and the barrel 16 which is a structure. Therefore, the radiation member 10 is provided at a position determined so that the radiation member 10 does not interfere with gas moving from the vicinity of the barrel 16 toward the cooling face 25 of the cryo pump 8. Therefore, the radiation member 10 hardly reduces the evacuation efficiency (absorption efficiency) of the cryo pump 8.

More specifically, the radiation member 10 may be provided so that the conductance achieved by the radiation member 10 provided between the barrel 16 and the cooling face of the cryo pump 8 is decreased by as much as 15% or less. Further, the radiation member 10 may be provided so that the conductance is decreased by as much as 10% or less.

Further, the temperature sensor 13 is provided at a position determined so that thermal influences exerted by the cooling face of the cryo pump 8 and the radiation member 10 on the temperature sensor 13 become approximately identical to each other. By keeping the temperature measured at the above-described position constant, it becomes possible to make the amount of heat absorbed from the projection-optical-system space 7 into the cooling face 25 approximately equal to that emitted from the radiation member 10 into the projection-optical-system space 7. Namely, the radiation member 10 can cancel the influence of the heat absorbed from the barrel 16 into the cooling face 25. Further, in the above-described embodiment, the temperature sensor 13 is provided on the central axis of the cooling face 25 of the cryo pump 8.

Further, the temperature sensor 13 may be provided at a position where the temperature sensor 13 is significantly affected by the cooling face 25 and the radiation member 10. Consequently, the sensitivity of the temperature sensor is increased.

Further, if the temperature of the position where the temperature sensor 13 is provided is affected by a different heat generation member including a sensor and/or a circuit substrate, control should be performed so that the position is held at a temperature higher than a reference temperature by as much as a temperature increase caused by the heat generation member.

The radiation member 10 is provided around the cooling face 25 of the cryo pump 8. More specifically, the radiation member 10 is provided to satisfy at least one of the following conditions.

(a2) The shortest distance between the barycenter of the radiation plate 21 of the radiation member 10 and the cooling face 25 of the cryo pump 8 is shorter than the diameter of the cooling face 25. However, when a plurality of the radiation plates 21 is provided for the cooling face 25 of a single cryo pump 8, the barycenter of the radiation plate 21 is calculated based on the radiation plates 21.

(b2) The area of the radiation plate 21 of the radiation member 10 is ten times as large as the area of the cooling face 25 of the cryo pump 8 or less.

(c2) The shortest distance between the radiation plate 21 of the radiation member 10 and the cooling face 25 is shorter than the diameter of the cooling face 25.

The radiation member 10 is provided at a position determined to satisfy the above-described conditions. Consequently, the direction in which the cooling face 25 of the cryo pump 8 is provided becomes almost the same as that in which the radiation member 10 is provided with reference to the barrel 16. Therefore, it becomes possible to equalize the amount of heat emitted toward the cooling face 25 of the cryo pump 8 and that absorbed from the radiation member 10 at each of positions defined on the barrel 16. Therefore, the temperature distribution of the barrel 16 can be significantly reduced.

Third Embodiment

Figure 6:
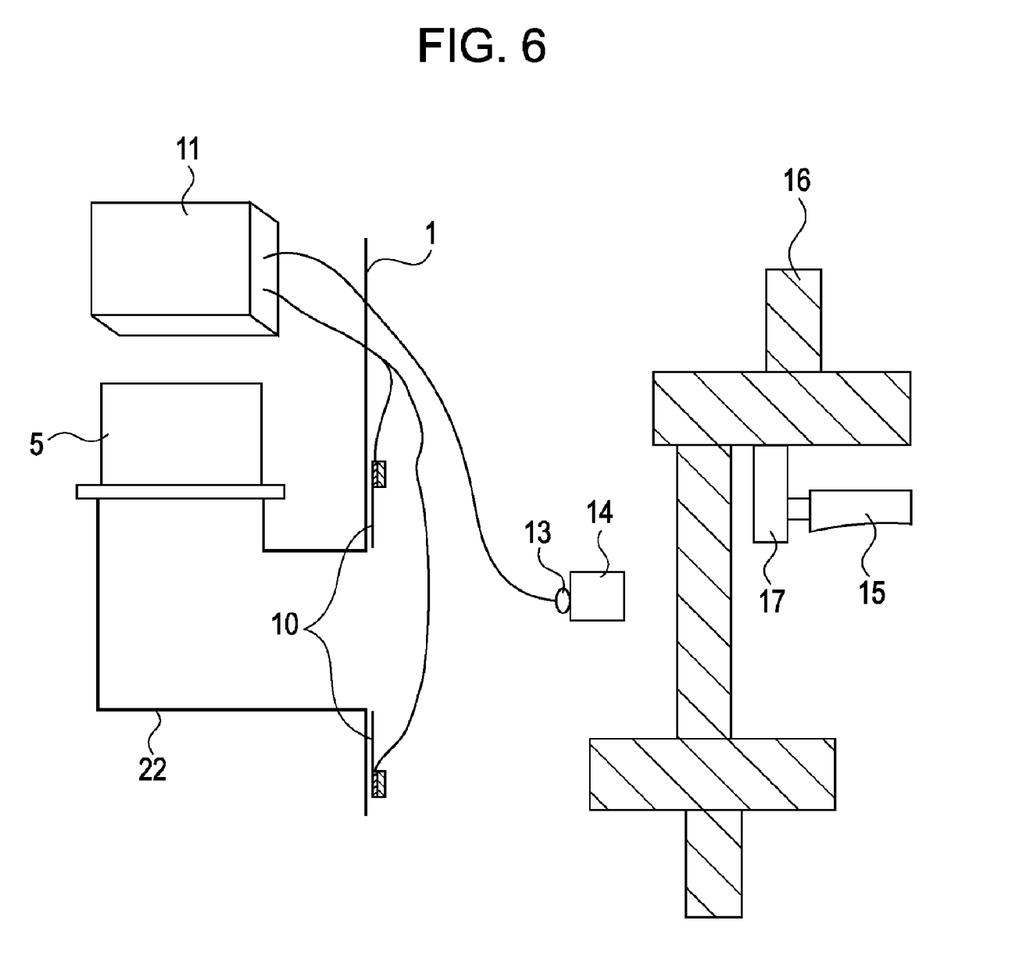
FIG. 6 is a diagram schematically showing the principal mechanism of a third embodiment of the present invention.

FIG. 6 is a diagram schematically showing the principal mechanism of a third embodiment of the present invention. The descriptions of the same configurations as those of the first embodiment will be omitted.

The above-described embodiment is different from the first embodiment in that the temperature sensor 13 is attached to a reference temperature member 14.

The reference temperature member 14 of the above-described embodiment is provided between the opening of the duct 22 connecting the turbo molecular pump 5 to the vacuum chamber 1 and the barrel 16, and on the central axis of the duct 22. However, since the reference temperature member 14 is sufficiently small for the opening of the duct 22, the reference temperature member 14 hardly reduces the evacuation efficiency of the turbo molecular pump 5.

The reference temperature member 14 includes a material having a high radiation rate, or is processed to increase the radiation rate of the top face of the reference temperature member 14 so that the a radiation rate of 0.6 or more is obtained. Further, the reference temperature member is held by a holding member via a large thermal resistance. Consequently, the sensitivity to a change in the temperature of each of the turbo molecular pump 5 and the radiation member 10 of the reference temperature member can be increased. Therefore, attaching the temperature sensor 13 to the reference temperature member 14 allows for detecting the temperature with high precision.

Further, the temperature sensor 13 and the reference temperature member 14 may be provided at a position determined so that thermal influences exerted by the turbo molecular pump 5 and the radiation member 10 on the temperature sensor 13 and the reference temperature member 14 become approximately identical to each other, as is the case with the first embodiment. Further, the temperature sensor 13 and the reference temperature member may be provided at a position determined so that they are significantly affected by the turbo molecular pump 5 and the radiation member 10.

Further, the reference temperature member 14 of the above-described embodiment can be used in the case where the cryo pump 8 is used as the vacuum pump, as is the case with the second embodiment.

Fourth Embodiment

Figure 7:
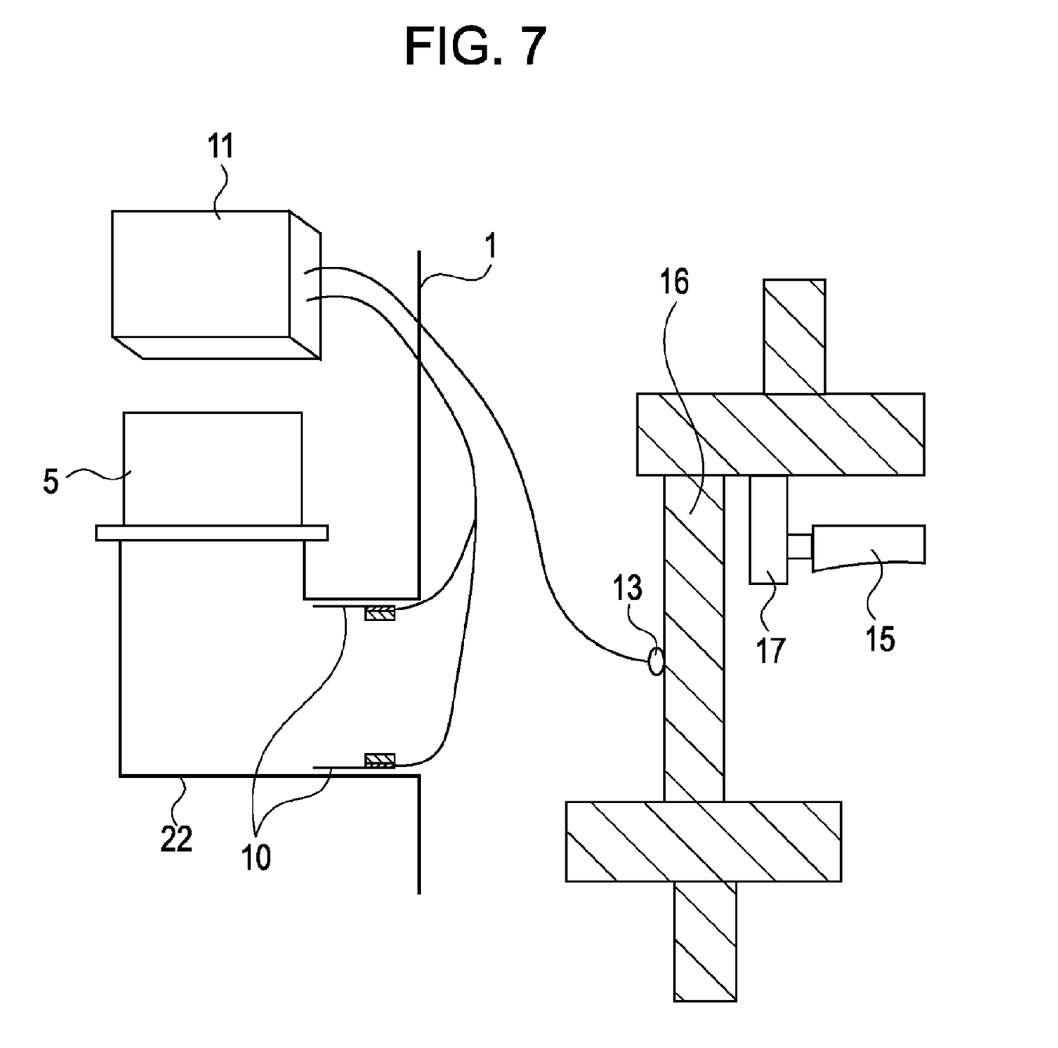
FIG. 7 is a diagram schematically showing the principal mechanism of a fourth embodiment of the present invention.

FIG. 7 is a diagram schematically showing the principal mechanism of a fourth embodiment of the present invention. The descriptions of the same configurations as those of the first embodiment will be omitted.

The above-described embodiment is different from the first embodiment in that the radiation member 10 is arranged in the duct 22 connecting the turbo molecular pump 5 to the vacuum chamber 1.

Since the radiation plate 21 of the radiation member 10 of the above-described embodiment is provided so as to be parallel to the wall face of the duct 22, the evacuation efficiency of the turbo molecular pump 5 is hardly decreased.

Further, since the radiation member 10 is provided in the duct 22, the thermal influences of the turbo molecular pump 5 and the radiation member 10 are canceled through the opening of the duct 22. Therefore, it becomes possible to reduce the thermal influence exerted by the turbo molecular pump 5 on the barrel 16.

The radiation member 10 is provided in the duct 22 so that the direction in which the vacuum-chamber-1's side opening of the duct 22 connecting the turbo molecular pump 5 to the vacuum chamber 1 is arranged becomes the same as that in which the radiation member 10 is arranged with reference to the barrel 16. Therefore, it becomes possible to equalize the amount of heat absorbed from the turbo molecular pump 5 and that emitted toward the radiation member 10 at each of positions defined on the barrel 16. Therefore, the temperature distribution of the barrel 16 can be significantly reduced.

Further, the above-described embodiment in which the radiation member 10 is provided in the duct 22 can be used for the third embodiment in which the temperature sensor 13 is attached to the reference temperature member 14.

Fifth Embodiment

Figure 8:
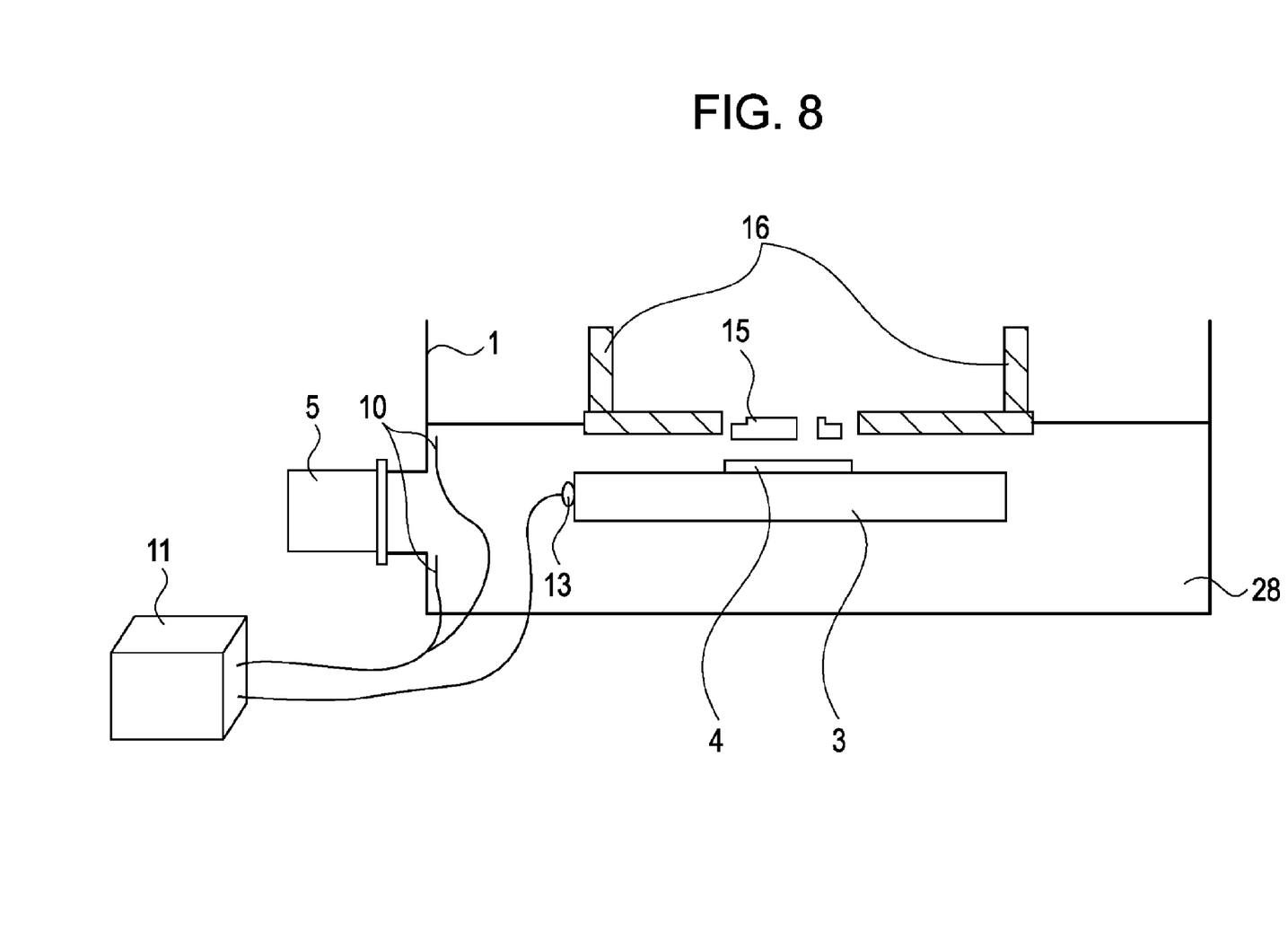
FIG. 8 is a diagram schematically showing the principal mechanism of a fifth embodiment of the present invention.

FIG. 8 is a diagram schematically showing the principal mechanism of a fifth embodiment of the present invention. In the above-described embodiment, the turbo molecular pump 5 is used to increase the degree of vacuum of the wafer-stage space 28. For reducing the thermal influence of the turbo molecular pump 5, the radiation member 10 is provided around the vacuum-chamber-1's side opening of the duct 22 connecting the turbo molecular pump 5 and the vacuum chamber 1 to each other.

Further, a wafer stage 3 on which the wafer 4 is placed is provided at a position opposite to the vacuum-chamber-1's side opening of the duct 22 and the radiation member 10. The temperature sensor 13 configured to measure the temperature of the wafer stage 3 is attached to the wafer stage 3, and the temperature sensor 13 is connected to the temperature controller 11. Then, the temperature controller 11 controls the temperature of the radiation member 10, so as to keep the measured temperature of the temperature sensor 13 constant.

The radiation member 10 is arranged at a position determined so that the radiation member 10 hardly intercepts a heat exchange achieved by radiation between the turbo molecular pump 5 and the wafer stage 3 corresponding to a structure.

Namely, the radiation member 10 is provided at a position determined so that the radiation member 10 does not interfere with gas moving from the vicinity of the wafer stage 3 toward the turbo molecular pump 5. Therefore, the radiation member 10 hardly reduces the evacuation efficiency of the turbo molecular pump 5.

More specifically, the radiation member 10 may be provided so that the conductance between the turbo molecular pump 5 and the wafer stage 3 is decreased by as much as 15% or less. Further, the radiation member 10 may be provided so that the conductance is decreased by as much as 10% or less.

Further, the temperature sensor 13 is provided at a position determined so that thermal influences exerted by the turbo molecular pump 5 and the radiation member 10 on the temperature sensor 13 become approximately identical to each other. By keeping the temperature measured at the above-described position constant, it becomes possible to make the amount of heat emitted from the turbo molecular pump 5 into the wafer-stage space 28 approximately equal to that absorbed from the wafer-stage space 28 into the radiation member 10. Namely, the radiation member 10 can cancel the thermal influence exerted by the turbo molecular pump 5 on the wafer stage 3. Further, in the above-described embodiment, the temperature sensor 13 is arranged on the central axis of the duct 22 connecting the turbo molecular pump 5 to the vacuum chamber 1.

Further, the temperature sensor 13 may be provided at a position where the temperature sensor 13 is significantly affected by the turbo molecular pump 5 and the radiation member 10. Consequently, the sensitivity of the temperature sensor 13 is increased.

Further, if the temperature of the position where the temperature sensor 13 is provided is affected by a different heat generation member including a sensor and/or a circuit substrate, control should be performed so that the position is held at a temperature higher than a reference temperature by as much as a temperature increase caused by the heat generation member.

The specific configuration of the radiation member 10 is the same as that of the first embodiment, and the temperature distribution of the wafer stage 3 can be significantly decreased by arranging the radiation member 10 so as to satisfy the conditions (a1), (b1), and (c1) that are described in the first embodiment.

Further, the same configurations as those of the second, third, and fourth embodiments can be used for the above-described embodiment relating to the wafer-stage space 28.

Sixth Embodiment

Figure 9:
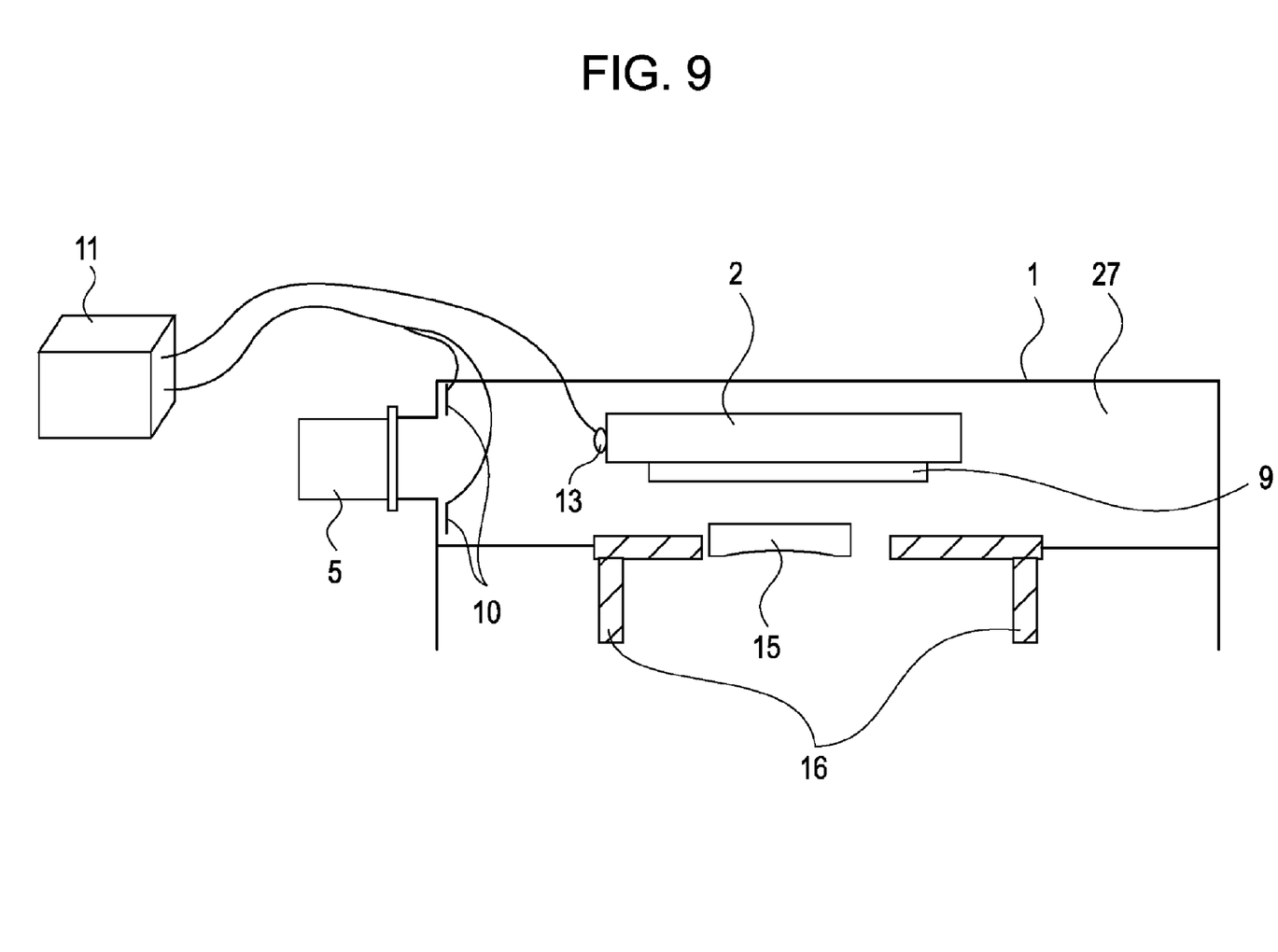
FIG. 9 is a diagram schematically showing the principal mechanism of a sixth embodiment of the present invention.

FIG. 9 is a diagram schematically showing the principal mechanism of a sixth embodiment of the present invention. In the above-described embodiment, the turbo molecular pump 5 is used to increase the degree of vacuum of the reticle-stage space 27. For reducing the thermal influence of the turbo molecular pump 5, the radiation member 10 is provided around the vacuum-chamber-1's side opening of the duct 22 connecting the turbo molecular pump 5 and the vacuum chamber 1 to each other.

Further, the reticle stage 2 on which the reticle 9 is placed is arranged at a position opposite to the vacuum-chamber-1's side opening of the duct 22 and the radiation member 10. The temperature sensor 13 configured to measure the temperature of the reticle stage 2 is attached to the reticle stage 2, and the temperature sensor 13 is connected to the temperature controller 11. Then, the temperature controller 11 controls the temperature of the radiation member 10, so as to keep the measured temperature of the temperature sensor 13 constant.

The radiation member 10 is arranged at a position determined so that the radiation member 10 hardly intercepts a heat exchange achieved by radiation between the turbo molecular pump 5 and the reticle stage 2 corresponding to a structure. Namely, the radiation member 10 is provided at a position determined so that the radiation member 10 does not interfere with gas moving from the vicinity of the reticle stage 2 toward the turbo molecular pump 5. Therefore, the radiation member 10 hardly reduces the evacuation efficiency of the turbo molecular pump 5.

More specifically, the radiation member 10 may be provided so that the conductance between the turbo molecular pump 5 and the reticle stage 2 is decreased by as much as 15% or less. Further, the radiation member 10 may be provided so that the conductance is decreased by as much as 10% or less.

Further, the temperature sensor 13 is provided at a position determined so that thermal influences exerted by the turbo molecular pump 5 and the radiation member 10 on the temperature sensor 13 become approximately identical to each other. By keeping the temperature measured at the above-described position constant, it becomes possible to make the amount of heat emitted from the turbo molecular pump 5 into the reticle-stage space 27 approximately equal to that absorbed from the reticle-stage space 27 into the radiation member 10. Namely, the radiation member 10 can cancel the thermal influence exerted by the turbo molecular pump 5 on the reticle stage 2. Further, in the above-described embodiment, the temperature sensor 13 is provided on the central axis of the duct 22 connecting the turbo molecular pump 5 to the vacuum chamber 1.

Further, the temperature sensor 13 may be provided at a position where the temperature sensor 13 is significantly affected by the turbo molecular pump 5 and the radiation member 10. Consequently, the sensitivity of the temperature sensor 13 is increased.

Further, if the temperature of the position where the temperature sensor 13 is provided is affected by a different heat generation member including a sensor and/or a circuit substrate, control should be performed so that the position is held at a temperature higher than a reference temperature by as much as a temperature increase caused by the heat generation member.

The specific configuration of the radiation member 10 is the same as that of the first embodiment, and the temperature distribution of the reticle stage 2 can be significantly decreased by arranging the radiation member 10 so as to satisfy the conditions (a1), (b1), and (c1) that are described in the first embodiment.

Further, the same configurations as those of the second, third, and fourth embodiments can be used for the above-described embodiment relating to the reticle-stage space 27.

Thus, the exposure apparatuses according to the embodiments of the present invention have been described. However, without being limited to the above-described embodiment, the present invention can be modified and changed in various ways without leaving the scope of the spirit of the present invention.

Further, a device including a semiconductor integrated circuit element, a liquid-crystal display element, and so forth is manufactured by performing the step of exposing a substrate including a wafer, a glass plate, and so forth on which a photoresist is applied to light, the step of developing the substrate, and other known steps by using the exposure apparatus according to any one of the above-described embodiments.

According to an embodiment of the present invention, it becomes possible to reduce a thermal influence exerted by a vacuum pump on a structure without decreasing the evacuation efficiency of the vacuum pump.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-218457 filed on Aug. 27, 2008, which is hereby incorporated by reference herein in its entirety.

What is claimed is:

1. An exposure apparatus comprising:
a vacuum container accommodating a structure;
a vacuum pump configured to increase a degree of vacuum achieved inside the vacuum container, the vacuum pump is a cryo pump;
a radiation unit configured to perform a heat exchange through radiation for the structure;
a temperature detecting unit configured to detect a temperature of the structure; and
a control unit configured to control the radiation unit based on the detected temperature,
wherein the radiation unit is arranged at a position determined so that the radiation unit does not interfere with a heat exchange achieved through radiation between the vacuum pump and the structure, the radiation unit is arranged at a position determined so that the radiation unit does not shield a cooling face of the cryo pump, a radiation plate of the radiation unit is provided around the cooling face of the cryo pump, wherein a distance between a barycenter of the radiation plate and the cooling face is shorter than a diameter of the cooling face.

2. The exposure apparatus according to claim 1, wherein an area of the radiation plate is ten times as large as an area of the cooling face or less.

3. The exposure apparatus according to claim 1, wherein a shortest distance between the radiation plate and the cooling face is shorter than a diameter of the cooling face.

4. The exposure apparatus according to claim 1, wherein the structure is a barrel holding an optical system.

5. The exposure apparatus according to claim 1, wherein the structure is a reticle stage.

6. The exposure apparatus according to claim 1, wherein the structure is a wafer stage.

7. An exposure apparatus comprising:
a vacuum container accommodating a structure;
a vacuum pump configured to increase a degree of vacuum achieved inside the vacuum container, the vacuum pump is a cryo pump;
a radiation unit configured to perform a heat exchange through radiation for the structure, the radiation unit is arranged at a position determined so that the radiation unit does not shield a cooling face of the cryo pump, a radiation plate of the radiation unit is provided around the cooling face of the cryo pump, wherein a distance between a barycenter of the radiation plate and the cooling face is shorter than a diameter of the cooling face;
a temperature detecting unit configured to detect a temperature of the structure; and
a control unit configured to control the radiation unit based on the detected temperature,
wherein the radiation unit is arranged at a position determined so that the radiation unit does not interfere with a heat exchange achieved through radiation between the vacuum pump and the structure,
wherein a second vacuum pump is a turbo molecular pump, the turbo molecular pump is connected to the vacuum container through a duct, and a second radiation unit is arranged at a position determined so that the second radiation unit does not shield an opening of the duct,
wherein the second radiation unit is provided around the opening and a distance between a barycenter of a second radiation plate of the second radiation unit and the opening is shorter than a diameter of the opening.
wherein the radiation unit is provided around the opening and a distance between a barycenter of a radiation plate of the radiation unit and the opening is shorter than a diameter of the opening.

8. The exposure apparatus according to claim 7, wherein an area of the second radiation plate is ten times as large as an area of the opening or less.

9. The exposure apparatus according to claim 7, wherein a shortest distance between the second radiation plate and the opening is shorter than a diameter of the opening.

10. A device manufacturing method comprising the steps of:
exposing a substrate to light by using an exposure apparatus comprising:
a vacuum container accommodating a structure;
a vacuum pump configured to increase a degree of vacuum achieved inside the vacuum container, the vacuum pump is a cryo pump;
a radiation unit configured to perform a heat exchange through radiation for the structure;
a temperature detecting unit configured to detect a temperature of the structure; and
a control unit configured to control the radiation unit based on the detected temperature,
wherein the radiation unit is arranged at a position determined so that the radiation unit does not interfere with a heat exchange achieved through radiation between the vacuum pump and the structure, the radiation unit is arranged at a position determined so that the radiation unit does not shield a cooling face of the cryo pump, a radiation plate of the radiation unit is provided around the cooling face of the cryo pump, wherein a distance between a barycenter of the radiation plate and the cooling face is shorter than a diameter of the cooling face; and developing the exposed substrate.

* * * * *